(12) United States Patent
Shen et al.

(10) Patent No.: US 9,343,127 B1
(45) Date of Patent: May 17, 2016

(54) MEMORY DEVICE HAVING AN ADAPTABLE NUMBER OF OPEN ROWS

(71) Applicant: QUALCOMM Incorporated, San Diego, CA (US)

(72) Inventors: Jian Shen, San Diego, CA (US); Liyong Wang, Raleigh, NC (US); Lew Chua-Eoan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/988,079

(22) Filed: Jan. 5, 2016

Related U.S. Application Data (62) Division of application No. 13/736,662, filed on Jan. 8, 2013, now Pat. No. 9,281,036.

(51) Int. Cl.
| | |
|---|---|
| *G06F 12/00* | (2006.01) |
| *G11C 8/18* | (2006.01) |
| *G11C 8/10* | (2006.01) |
| *G11C 8/06* | (2006.01) |
| *G06F 3/06* | (2006.01) |

(Continued)

(52) U.S. Cl.
CPC ............... *G11C 8/18* (2013.01); *G06F 3/0604* (2013.01); *G06F 3/0638* (2013.01); *G06F 3/0653* (2013.01); *G06F 3/0673* (2013.01); *G06F 12/0802* (2013.01); *G06F 12/10* (2013.01); *G11C 8/06* (2013.01); *G11C 8/10* (2013.01); *G06F 2212/1016* (2013.01); *G06F 2212/60* (2013.01)

(58) Field of Classification Search
CPC ........... G11C 7/00; G06F 12/00; G06F 13/00; G06F 13/1689; G06F 13/1663

USPC .......................................... 711/100, 154, 167
See application file for complete search history.

(56) References Cited

U.S. PATENT DOCUMENTS

| | | |
|---|---|---|
| 6,389,514 B1 | 5/2002 | Rokicki |
| 6,625,685 B1 | 9/2003 | Cho et al. |
| 7,353,320 B2 | 4/2008 | Jeddeloh |

(Continued)

FOREIGN PATENT DOCUMENTS

WO   2007002324 A2   1/2007

OTHER PUBLICATIONS

International Search Report and Written Opinion—PCT/US2014/010544—ISA/EPO—Jun. 12, 2014.

*Primary Examiner* — Tuan Thai
(74) *Attorney, Agent, or Firm* — Chui-kiu Teresa Wong; Paul Holdaway (57) ABSTRACT

A memory device comprises a memory array, at least one row address buffer, a set of row data buffers, a row decoder, an array of sense amplifiers, and a demultiplexer. The memory array comprises data elements organized into rows and columns. Each of the rows is addressable by a row address. Each of the data elements in each of the rows is addressable by a column address. The at least one row address buffer holds a selected row address of a set of successive selected row addresses. The set of row data buffers holds respective contents of selected rows that correspond to the set of successive selected row addresses. The row decoder decodes the selected row address to access a selected row. The array of sense amplifier reads the selected row and transmits content of the selected row to one of the row data buffers through the demultiplexer, and writes the content of the selected row back to the selected row.

6 Claims, 10 Drawing Sheets

(51) Int. Cl.
*G06F 12/08* (2016.01)
*G06F 12/10* (2016.01)

(56) References Cited

U.S. PATENT DOCUMENTS

| | | | |
|---|---|---|---|
| 7,389,402 B2 | 6/2008 | Zuraski, Jr. et al. | |
| 7,917,676 B2 | 3/2011 | Sullivan, Jr. et al. | |
| 7,958,301 B2 | 6/2011 | Sutardja | |
| 2005/0066113 A1* | 3/2005 | Rajamony | G06F 13/1631 711/105 |
| 2005/0078506 A1 | 4/2005 | Rao et al. | |
| 2005/0081002 A1* | 4/2005 | Chang | G06F 1/3225 711/154 |
| 2006/0092713 A1 | 5/2006 | Roohparvar et al. | |
| 2008/0183977 A1* | 7/2008 | Gower | G06F 12/0215 711/154 |
| 2008/0282028 A1* | 11/2008 | Balakrishnan | G06F 12/0215 711/105 |
| 2012/0051150 A1 | 3/2012 | Mirichigni et al. | |
| 2012/0221774 A1 | 8/2012 | Atkisson et al. | |
| 2014/0195764 A1 | 7/2014 | Shen et al. | |

* cited by examiner

MEMORY DEVICE HAVING AN ADAPTABLE NUMBER OF OPEN ROWS

CROSS-REFERENCE TO RELATED APPLICATION

This application is a divisional of U.S. patent application Ser. No. 13/736,662, entitled "MEMORY DEVICE HAVING AN ADAPTABLE NUMBER OF OPEN ROWS" and filed on Jan. 8, 2013, which is expressly incorporated by reference herein in its entirety.

FIELD OF DISCLOSURE

The presently disclosed embodiments are directed to the field of memory devices, and more particularly, to a memory device capable of having an adaptable number of open rows.

BACKGROUND

Synchronous dynamic random access memory (SDRAM) devices are various types of dynamic random access memory (DRAM) that operate synchronously with an external clock signal, such as a system clock signal. The input and output data of an SDRAM are synchronized to an active edge of the system clock signal. Double data rate (DDR) SDRAMs are faster memory devices that provide twice the operating speed of a conventional SDRAM. DDR SDRAMs allow data transfers on both the rising and falling edges of the system clock signal. DDR SDRAMs are typically used in a multicore system.

An SDRAM or DDR SDRAM comprises a set of memory arrays (also called banks). Each memory array comprises data elements organized into rows and columns. Each of the data elements in a row is addressable by a column address, and is typically a data word. A row is also called a page. Currently, in a SDRAM or DDR SDRAM, only one row can be open at a time. Once the content of an open row is latched in a row data buffer, subsequent memory requests to different column addresses in the open row can be serviced quickly from the row data buffer. Such a memory access is termed a row hit. If a different row is requested and the different row needs to be open, the memory access is termed a row miss. For row hits, only the row data buffer is utilized, and no access is necessary to the memory array.

SDRAMs or DDR SDRAM are typically used in a multicore system. A multicore system comprises a plurality of processors. The processors typically request memory access with diverse memory access patterns. Due to the diverse memory access patterns of the requestors, the fixed row size in an SDRAM or DDR SDRAM may result in sub-optimal power or sub-optimal performance of the SDRAM or DDR SDRAM.

Using a large row size may increase the number of row hits in general, but would result in increase of power consumption in opening a row. Using a small row size may reduce the power consumption in opening a row, but may result in poor performance because there will be fewer row hits for requestors with high access locality.

SUMMARY

Exemplary embodiments of the invention are directed to a memory device having an adaptable number of open rows, a method of opening rows in such a device, a memory controller for accessing such memory device, and a system including such memory device.

One embodiment of the invention is a memory device. The memory device comprises a memory array, at least one row address buffer, a set of row data buffers, a row decoder, an array of sense amplifiers, and a demultiplexer. The memory array comprises data elements organized into rows and columns. Each of the rows is addressable by a row address. Each of the data elements in a row is addressable by a column address. The at least one row address buffer is for holding a selected row address of a set of successive selected row addresses. The set of row data buffers is for holding respective contents of selected rows corresponding to the set of successive selected row addresses. The row decoder coupled to the at least one row address buffer and to the memory array is for receiving the selected row address and for decoding the selected row address to access a selected row of the memory array. The array of sense amplifiers coupled to the memory array and coupled to the set of row data buffers is for reading the selected row and transmitting content of the selected row to one of the row data buffers, and for writing the content of the selected row back to the selected row. The demultiplexer coupled to the array of sense amplifiers and the set of row data buffers is for providing the content of the selected row from the array of sense amplifiers to the one of the row data buffers.

One embodiment of the invention is a method of opening rows in a memory device. The memory device includes a memory array comprising data elements organized into rows and columns, each of the rows being addressable by a row address, each of the data elements in a row being addressable by a column address. The method comprises the operations of: (a) receiving a first command to open a row, the command including a selected row address and a row mode indicator specifying a number of rows to open starting from the selected row address; (b) loading the selected row address into at least one row address buffer; (c) decoding the selected row address to access a selected row in the memory array using a row decoder; (d) reading the selected row and transmitting content of the selected row to a corresponding row data buffer of a set of row data buffers using an array of sense amplifiers; and, if the specified number of rows to open is greater than one, then: (e) computing a successive selected row address based on the selected row address; and (f) repeating operations (b), (c), and (d) with the selected row address being replaced by the successive selected row address.

One embodiment of the invention is a memory controller for accessing a memory device. The memory device includes a memory array comprising data elements organized into rows and columns. Each of the rows is addressable by a row address. Each of the data elements in a row is addressable by a column address. The memory device is capable of having an adaptable number of open rows. The memory controller comprises an arbiter, a memory mapper, and a command generator. The arbiter is for receiving and scheduling a memory access request from a requestor. The memory access request includes a logical address. The arbiter is configured to determine the adaptable number of open rows for the memory access request. The memory mapper is coupled to the arbiter for translating the logical address into a physical address including a row address and a column address. The command generator is coupled to the memory mapper and the arbiter for generating a sequence of commands corresponding to the memory access request and for sending the sequence of commands to the memory device. One command of the sequence of commands includes a row mode indicator specifying the adaptable number of open rows.

One embodiment of the invention is a system comprising a memory device capable of having an adaptable number of open rows, a memory controller, and a processor. The memory device includes a memory array comprising data elements organized into rows and columns, each of the rows being addressable by a row address, each of the data elements in a row being addressable by a column address. The memory device comprises a set of row data buffers for holding contents of the adaptable number of rows. The memory controller is configured to receive memory access requests from a requestor and is coupled to the memory device for accessing the memory device. The processor is coupled to the memory controller. The processor is capable of executing a row determination module. The adaptable number of open rows is determined either by the memory controller from monitoring memory access pattern of the requestor or by the processor from executing the row determination module.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, etc. One embodiment may be described by a schematic drawing depicting a physical structure. It is understood that the schematic drawing illustrates the basic concept and may not be scaled or depict the structure in exact proportions.

As used herein, the term "coupled to" means "in electrical communication with". It does not necessarily imply "directly connected to". The elements that are coupled together may be directly connected to each other or may be in electrical communication with each other through one or more intervening elements.

Embodiments of the invention are directed to a memory device having an adaptable number of open rows, a method of opening rows in such a device, a memory controller for accessing such memory device, and a system including such memory device.

Figure 1:
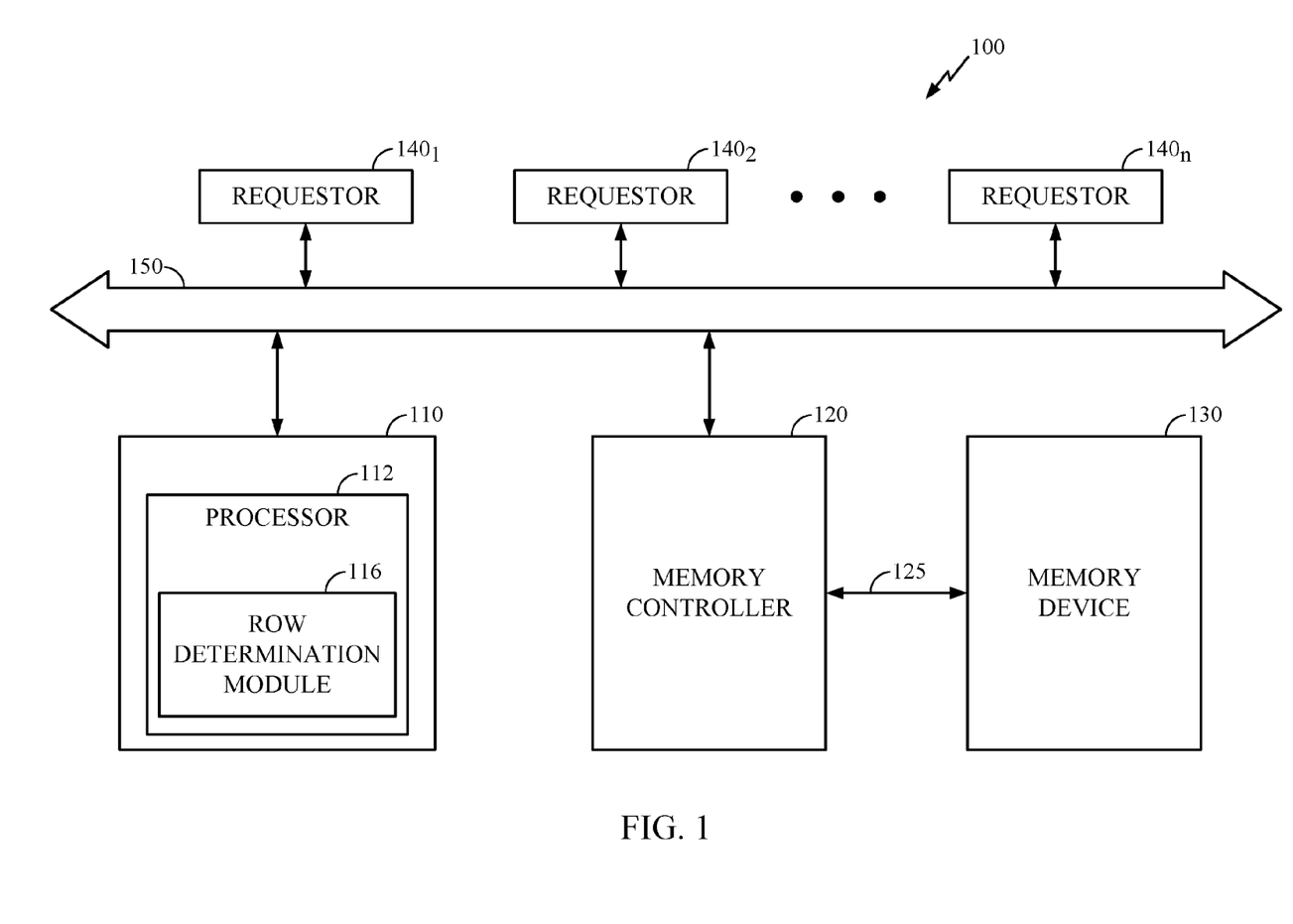
FIG. 1 is a diagram illustrating a system in which one embodiment of the invention may be practiced.

FIG. 1 is a diagram illustrating a system 100 in which one embodiment of the invention may be practiced. The system 100 comprises a central processing system 110, a memory controller 120, a memory device 130, and a plurality of requestors $140_i$ with i=1, 2, . . . , n.

The central processing system 110 includes a processor 112. The processor 112 may be in the form of a processor core with associated cache memory and memory management unit. The processor 112 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture.

The processor 112 may include a row determination module 116. The row determination module 116 may compute an adaptable number of rows to be open in the memory device 130 based on use cases. The row determination module 116 may be implemented as a hardware module or a software module. In one embodiment, the row determination module 116 is implemented as a software thread running on the processor 112 to monitor the memory controller 120 and compute an adaptable number of rows to be open in the memory device 130. In one embodiment, the processor 112 executes the row determination module 116 to obtain an adaptable number of rows to be open, and then provides the adaptable number of rows to be open to the memory controller 120.

The central processing system 110 may communicate with the memory controller 120 and with the requestors $140_i$, i=1, 2, . . . , n, via a bus 150.

The requestors $140_i$, with i=1, 2, . . . , n, may be different processors or other devices capable of sending memory access requests to the memory controller 120 via the bus 150.

The memory controller 120 is configured to receive memory access requests from the central processing system 110 and the requestors $140_i$, i=1, 2, . . . , n, via the bus 150 and to access the memory device 130 via a memory bus 125.

The memory controller 120 arbitrates among the different requestors (that is, the central processing system 110 and the requestors $140_i$, i=1, 2, . . . , n), prioritizes the different requestors, and grants service to each of the requestors one at a time in a scheduled manner. The memory controller 120 translates each memory access request into a sequence of commands and sends the sequence of commands to the memory device 130. One command of the sequence of commands includes a request to open a number of rows in the memory device 130. The number of rows to be open is adaptable. The maximum number of rows that can be open is equal to the number of row data buffers in a memory array of the memory device 130.

In one embodiment, the memory controller 120 determines the adaptable number of rows to be open by monitoring memory access pattern of the requestor being serviced. The requestor being serviced may be the central processing system 110 or one of the requestors 140$_i$, i=1, 2, . . . , n. Memory access locality may be determined from the memory access pattern of the requestor being serviced. The memory access locality refers to the concept that, if a particular memory location is requested at a particular time, then it is likely that nearby memory locations will be requested soon after.

The adaptable number of rows to be open is determined either by the memory controller 120 from monitoring memory access pattern of the requestor being serviced or by the processor 112 from executing the row determination module.

The memory device 130 includes a set of memory arrays (also called banks). Each memory array comprises data elements organized into rows and columns. Each of the rows is addressable by a row address. Each of the data elements in a row is addressable by a column address. The memory device 130 is capable of having an adaptable number of open rows in a memory array. The memory device 130 comprises a set of row data buffers for holding contents of the adaptable number of open rows.

The memory device 130 may be a synchronous dynamic random access memory (SDRAM), a double data rate synchronous dynamic random access memory (DDR SDRAM) or any other type of dynamic random access memory (DRAM).

The feature of the memory device 130 of having an adaptable number of open rows can be considered as the feature of having an adaptable page size where an open page can contain an adaptable number of open rows, not just one open row as in the prior art.

Figure 2:
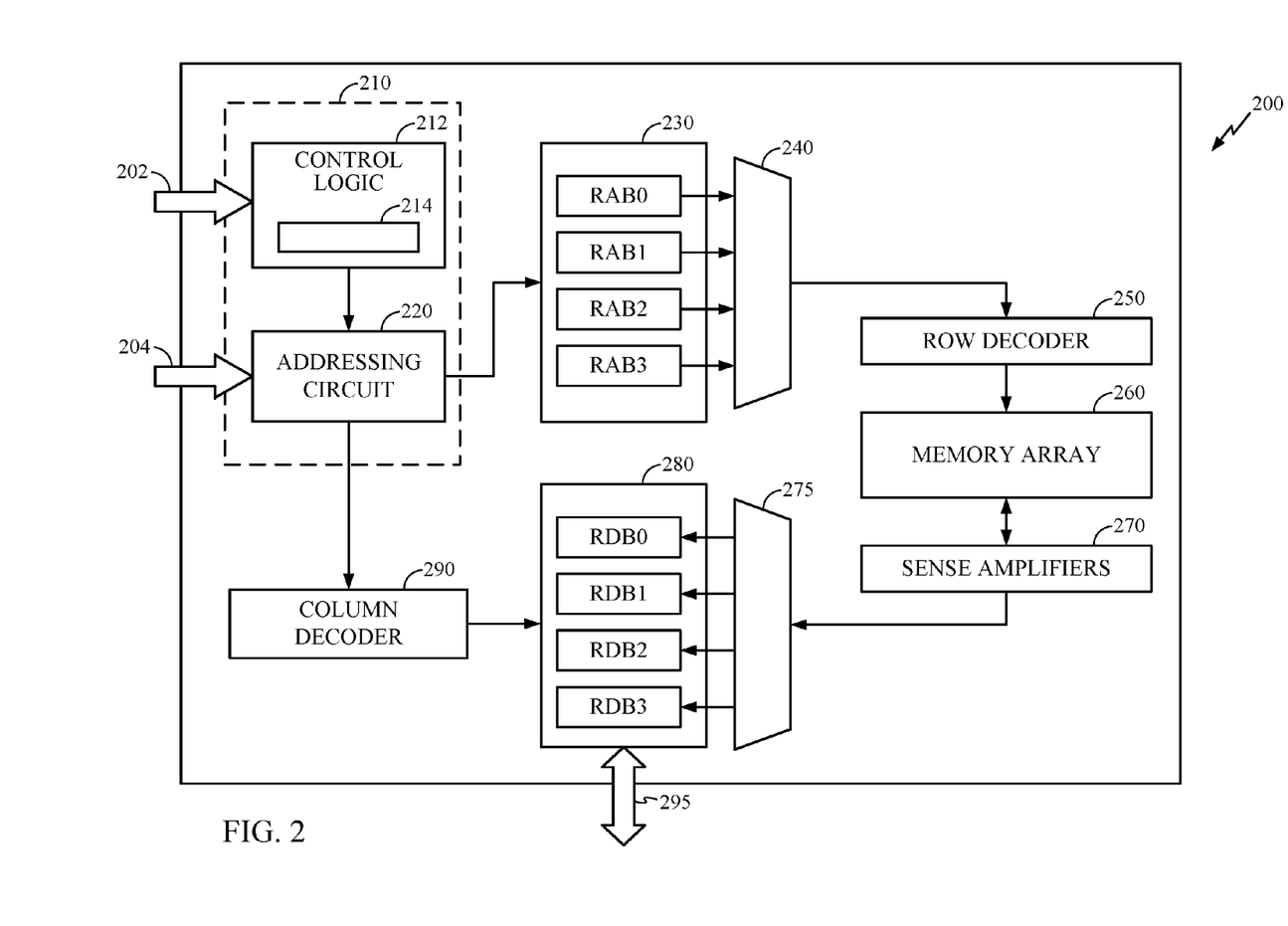
FIG. 2 illustrates an embodiment of a memory device constructed in accordance with one embodiment of the present invention.

FIG. 2 illustrates an embodiment 200 of a memory device constructed in accordance with one embodiment of the present invention. The system 200 comprises a set of memory arrays, each memory array having corresponding peripheral circuits. For clarity purpose, FIG. 2 illustrates the system 200 with only one memory array 260. The system 200 comprises a control circuit 210, a set of row address buffers 230, a multiplexer 240, a row decoder 250, a memory array 260, an array of sense amplifiers 270, a demultiplexer 275, a set of row data buffers 280, and a column decoder 290.

The control circuit 210 comprises a control logic 212 and an addressing circuit 220.

The control logic 212 is configured to receive control signals 202 as inputs. The control signals 202 include a command. The control logic 212 is configured to decode the command and drive the remaining circuitry of the system 200. In one implementation, the control signals 202 include a system clock (CK) signal, clock enable (CKE) signal, row address strobe (RAS) signal, column address strobe (CAS) signal, write enable (WE) signal, and chip select (CS) signal. The CK and CKE signals are used to synchronize the operation of the memory device 200 with the external system clock. Distinct combinations of the RAS, CAS, WE, and CS define distinct commands received by the control logic 212. When the command is an Activate command to open a specified row in the memory array 260, the control signals 202 also include a Load Mode Register command to load a row mode indicator into a memory mode register 214 of the control logic 212. The row mode indicator is used to specify a number of rows to be open.

The addressing circuit 220 is coupled to the control logic 212. The addressing circuit 220 receives decoded control signals from the control logic 212. The addressing circuit 220 receives address signals 204 as inputs. The address signals 204 provide the address part of a command. The addressing circuit 220 receives a row address from the address signals 204 with the Activate command. The addressing circuit 220 provides the received row address to the first buffer RAB0 of the set of row address buffers 230. If the row mode indicator in memory mode register 214 indicates that the number of rows to be open is M, for example, M equal to four, then the addressing circuit 220 computes the M−1 successive row addresses from the received row address and provides the M−1 successive row addresses to the remaining row address buffers RAB1, RAB2, RAB3 of the set of row data buffers 280, respectively. The addressing circuit 220 computes the M−1 successive row addresses from the received row address by using simple increment. It is noted that, in this embodiment, the number of row address buffers in the set of row address buffers 230 is equal to the number of row data buffers in the set of row data buffers 280. If there are N row data buffers in the set of row data buffers 280, then the row mode indicator can specify M rows to be open, provided that M is equal to or less than N. The addressing circuit 220 receives a column address from the address signals 204 with the Read or Write command. The addressing circuit 220 provides the received column address to the column decoder 290.

In one embodiment, the set of row address buffers 230 is implemented by using a single register that is configured to hold successive row addresses one at a time. The addressing circuit 220 dynamically computes the successive row addresses from the received row address. The set of row data buffers 280 is configured to hold contents of rows corresponding to the successive row addresses respectively, as the rows are read from the memory array 260 one at a time. In this embodiment, if there are N row data buffers in the set of row data buffers 280, then the row mode indicator can specify M rows to be open, provided that M is equal to or less than N. In this embodiment, where a single register is used to implement the row address buffers 230, the multiplexer 240 is not needed.

In the embodiment of FIG. 2 where the set of row address buffers 230 includes more than one row address buffer, the multiplexer 240 is coupled to the set of row address buffers 230 and coupled to the row decoder 250 to select a row address being held in a selected one of the row address buffers 230 and to provide the selected row address to the row decoder 250.

The row decoder 250 is coupled to the memory array 260. The row decoder 250 receives the selected row address from the multiplexer 240 (or from the single register in the embodiment where the single register is used to implement the row address buffers 230) and accesses a selected row that corresponds to the selected row address.

The memory array 260 comprises data elements organized into rows and columns. Each of the rows is addressable by a row address. Each of the data elements in a row is addressable by a column address.

The array of sense amplifiers 270 is coupled to the memory array 260 and coupled to the set of row data buffers 280 via the demultiplexer 275. The array of sense amplifiers 270 reads the selected row and transmits content of the selected row to one of the row data buffers 280. The array of sense amplifiers 270 is also used for writing the content of the selected row back to the selected row in the memory array 260 when a Precharge command is received by the control circuit 210. When a Precharge command is received by the control circuit 210, contents in the row data buffers 280 are written back one by one to the open rows in the memory array 260, using the array of sense amplifiers 270.

Instead of writing back to all the open rows one by one using contents in the row data buffers 280 when a Precharge command is received as described above, in one embodiment, the array of sense amplifiers 270 is configured to write the content of the selected row back to the selected row at completion of transmitting the content of the selected row to the one of the row data buffers 280.

The demultiplexer 275 is coupled to the array of sense amplifiers 270 and the set of row data buffers 280. The demultiplexer 275 provides the content of the selected row from the array of sense amplifiers to one of the row data buffers 280. The one of the row data buffers 280 that receives the content of the selected row corresponds to the one of the row address buffers 230 that holds the selected row address.

The set of row data buffers 280 corresponds to the set of row address buffers 230. Each row data buffer in the set of row data buffers 280 is used for holding content of a selected row corresponding to a selected row address being held in the corresponding row address buffer in the set of row address buffers 230. The set of row data buffers 280 is used for holding respective contents of selected rows corresponding to the set of successive selected row addresses being held in the row address buffers 230. The set of row data buffers 280 is used as input/output buffers for the system 200. In one embodiment, the set of row data buffers 280 comprises four row data buffers, as illustrated in FIG. 2. In another embodiment, the set of row data buffers 280 comprises two row data buffers. The row data buffers 280 may be implemented using flip-flops or pulse latches, or other structures of storage.

With a Read command or a Write command, the addressing circuit 220 receives a column address from the address signals 204. The Read command requests a read from a specified one of the open rows at the received column address. The Write command requests a write to a specified one of the open rows at the received column address. The specified one of the open rows corresponds to a row data buffer of the row data buffers 280. The addressing circuit 220 provides the received column address to the column decoder 290. The column decoder 290 accesses the row data buffer that holds the content corresponding to the specified one of the open rows and accesses the location within the content that corresponds to the column address. A read or write is then made to the content of the row data buffer at that location. A read request is serviced by transmitting the data from the row data buffer to the input/output port 295. In the case of a write request, the incoming data from the input/output port 295 is written to one of the row data buffers 280.

When a Precharge command is received by the control circuit 210 subsequent to an Activation command, the Precharge command is serviced by writing back to the open rows in the memory array one at a time using contents of the corresponding row data buffers and the array of sense amplifiers and by closing the open rows in the memory array. The addresses of the open rows are obtained from the set of row address buffers 230. In the embodiment where only one register is used to implement the set of row address buffers, the addresses of the open rows can be easily recomputed.

Figure 3:
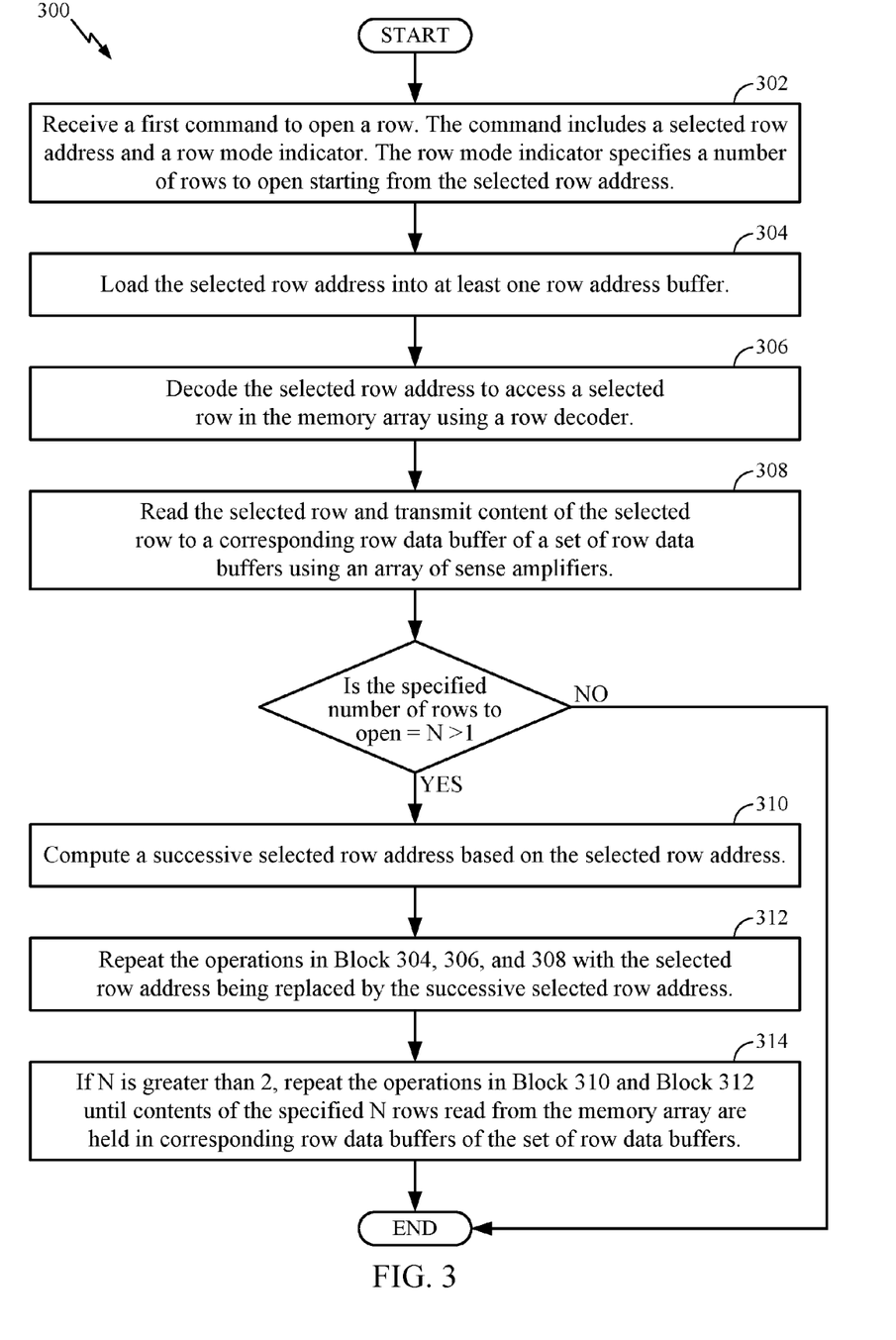
FIG. 3 is a flowchart illustrating a process of opening rows in a memory device constructed in accordance with one embodiment of the invention.

FIG. 3 is a flowchart illustrating a process 300 of opening rows in a memory device constructed in accordance with one embodiment of the invention. The memory device includes a memory array comprising data elements organized into rows and columns, each of the rows being addressable by a row address, each of the data elements in a row being addressable by a column address.

Upon Start, the process 300 receives a first command to open a row (Block 302). The command includes a selected row address and a row mode indicator. The row mode indicator specifies a number of rows to open starting from the selected row address. The process 300 loads the selected row address into at least one row address buffer (Block 304). The process 300 then decodes the selected row address to access a selected row in the memory array using a row decoder (Block 306). The process 300 reads the selected row and transmits content of the selected row to a corresponding row data buffer of a set of row data buffers using an array of sense amplifiers (Block 308). If the specified number of rows to open is not greater than one, then the process 300 is terminated. If the specified number of rows to open is greater than one, then the process 300 computes a successive selected row address based on the selected row address (Block 310) and repeats the operations in Block 304, 306, and 308 with the selected row address being replaced by the successive selected row address (Block 312). If the specified number of rows to open is equal to N where N is a number greater than two, the process 300 repeats the operations in Block 310 and Block 312 until contents of the specified N rows read from the memory array are held in corresponding row data buffers of the set of row data buffers (Block 314). The process 300 is then terminated.

Figure 4:
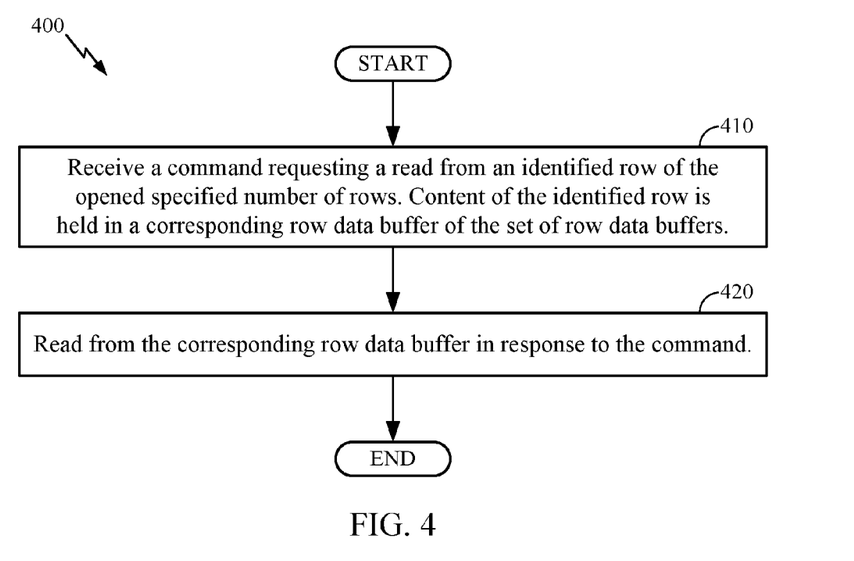
FIG. 4 is a flowchart illustrating a process of responding to a command requesting a read from a row in a memory device constructed in accordance with one embodiment of the invention.

FIG. 4 is a flowchart illustrating a process 400 of responding to a command requesting a read from a row in a memory device constructed in accordance with one embodiment of the invention. The Read command is subsequent to an Activate command.

Upon Start, the process 400 receives a command requesting a read from an identified row of the opened specified number of rows (Block 410). Content of the identified row is held in a corresponding row data buffer of the set of row data buffers. The process 400 reads from the corresponding row data buffer in response to the command (Block 420). The process 400 is then terminated.

Figure 5:
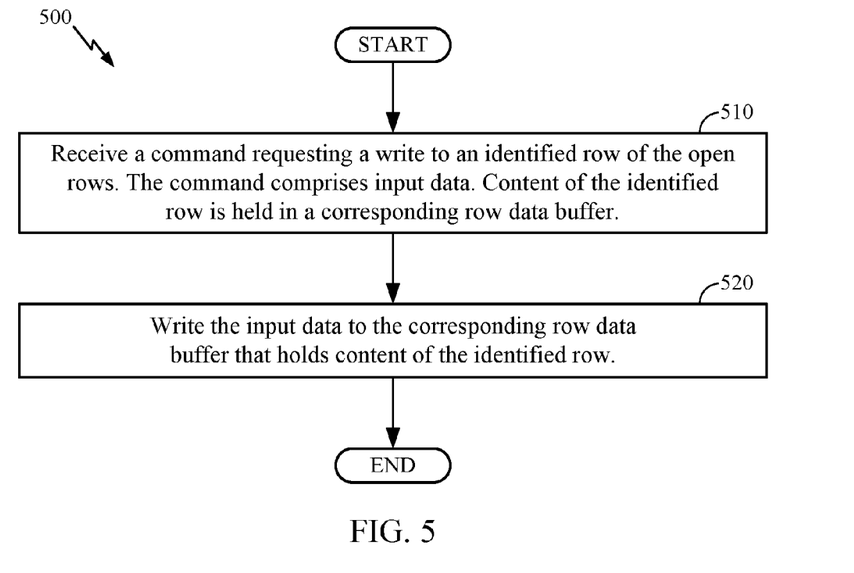
FIG. 5 is a flowchart illustrating a process of responding to a command requesting a write to a row in a memory device constructed in accordance with one embodiment of the invention.

FIG. 5 is a flowchart illustrating a process 500 of responding to a command requesting a write to a row in a memory device constructed in accordance with one embodiment of the invention. The Write command is subsequent to an Activate command.

Upon Start, the process 500 receives a command requesting a write to an identified row of the open rows (Block 510). The command comprises input data. Content of the identified row is held in a corresponding row data buffer. The process 500 writes the input data to the corresponding row data buffer that holds content of the identified row (Block 520). The process 500 is then terminated.

Figure 6:
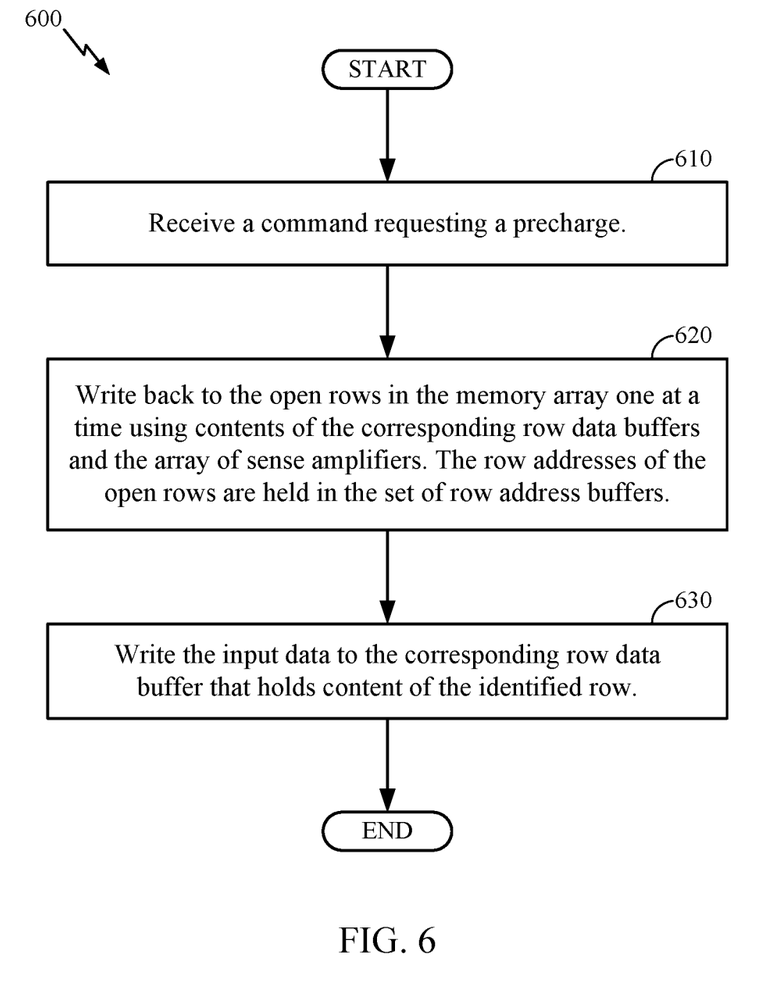
FIG. 6 is a flowchart illustrating a process of responding to a command requesting a precharge in a memory device constructed in accordance with one embodiment of the invention.

FIG. 6 is a flowchart illustrating a process 600 of responding to a command requesting a precharge in a memory device constructed in accordance with one embodiment of the invention. The Precharge command is subsequent to an Activate command.

Upon Start, the process 600 receives a command requesting a precharge (Block 610). The process 600 writes back to the open rows in the memory array one at a time using contents of the corresponding row data buffers and the array of sense amplifiers (Block 620). The row addresses of the open rows are held in the set of row address buffers. The process 600 then closes the open rows in the memory array (Block 630). The process 600 is then terminated.

Figure 7:
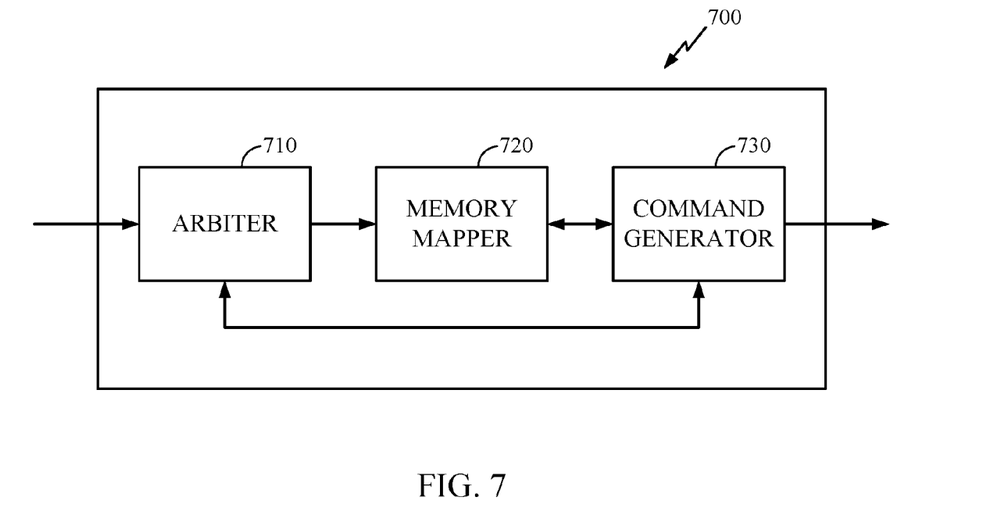
FIG. 7 is a diagram illustrating an embodiment of the memory controller 120 shown in FIG. 1.

FIG. 7 is a diagram illustrating an embodiment 700 of the memory controller 120 shown in FIG. 1. The system 700 comprises an arbiter 710, a memory mapper 720, and a command generator 730.

The arbiter 710 is configured to receive memory access requests from a plurality of requestors. The arbiter 710 is configured to arbitrate among the requestors to service one requestor at a time. The arbiter 710 schedules the memory access requests for service in an orderly manner. A memory access request from a requestor includes a logical address of a data element. The arbiter 710 is also configured to determine a number of rows to be opened in the memory array for a memory access request being serviced.

In one embodiment of the invention, the arbiter 710 determines a number of rows to be opened in the memory array in accordance with an instruction received from a processor 112 included in the central processing system 110. The instruction from the processor 112 specifies the number of rows to be opened in the memory array. The processor 112 of the central processing system 110 is capable of executing a row determination module 116 included in the processor 112. The executed row determination module 116 determines the number of rows to be opened in the memory array 260 based on use cases obtained by monitoring the system 700.

In another embodiment of the invention, the arbiter 710 determines a number of rows to be opened in the memory array by monitoring a memory access pattern of the requestor being serviced. The arbiter 710 monitors the memory use pattern of the requestor to measure the memory access locality. In one embodiment, the arbiter 710 is configured to monitor the memory access pattern of the requestor by monitoring a ratio of row misses to row hits, and to determine the number of rows to be opened to be more than one row when the ratio of row misses to row hits exceeds a threshold. In other embodiments, the operations of monitoring the memory access pattern of the requestor and determining the number of rows to be opened can be performed by another module included in the memory controller 120.

Once the content of an open row is latched in a row data buffer (or in the case of multiple open rows, contents of the open rows are latched in the row data buffers), subsequent memory requests to different column addresses in the open row (or open rows) can be serviced quickly from the row data buffer (or row data buffers). Such a memory access is termed a row hit. If a different row is requested and the content (or contents) of the row data buffer (or row data buffers) needs to be changed, the memory access is termed a row miss. For row hits, only the row data buffers 280 are utilized, and no access is necessary to the memory array 260.

The memory mapper 720 is coupled to the arbiter 710. The memory mapper 720 is configured to translate the logical address of the data element into a physical address including a row address and a column address.

The command generator 730 is coupled to the memory mapper 720 and the arbiter 710. The command generator 730 is configured to generate a sequence of commands corresponding to the memory access request and to send the sequence of commands to the memory device 130. One command of the sequence of commands includes a row mode indicator specifying the number of rows to be opened. For example, a Load Mode Register command is sent to the memory device 130 to load the row mode indicator into a memory mode register of the memory device 130.

In a typical SDRAM of the prior art, only one row can be open per memory array. The row stays open under the so-called "open page" policy of a memory controller. When a new row is requested to be open in the same memory array, the SDRAM closes the currently open row then activates the new row, incurring long latency penalty. The various commands and time delays involved in operations of a typical SDRAM are described below.

Figure 8:
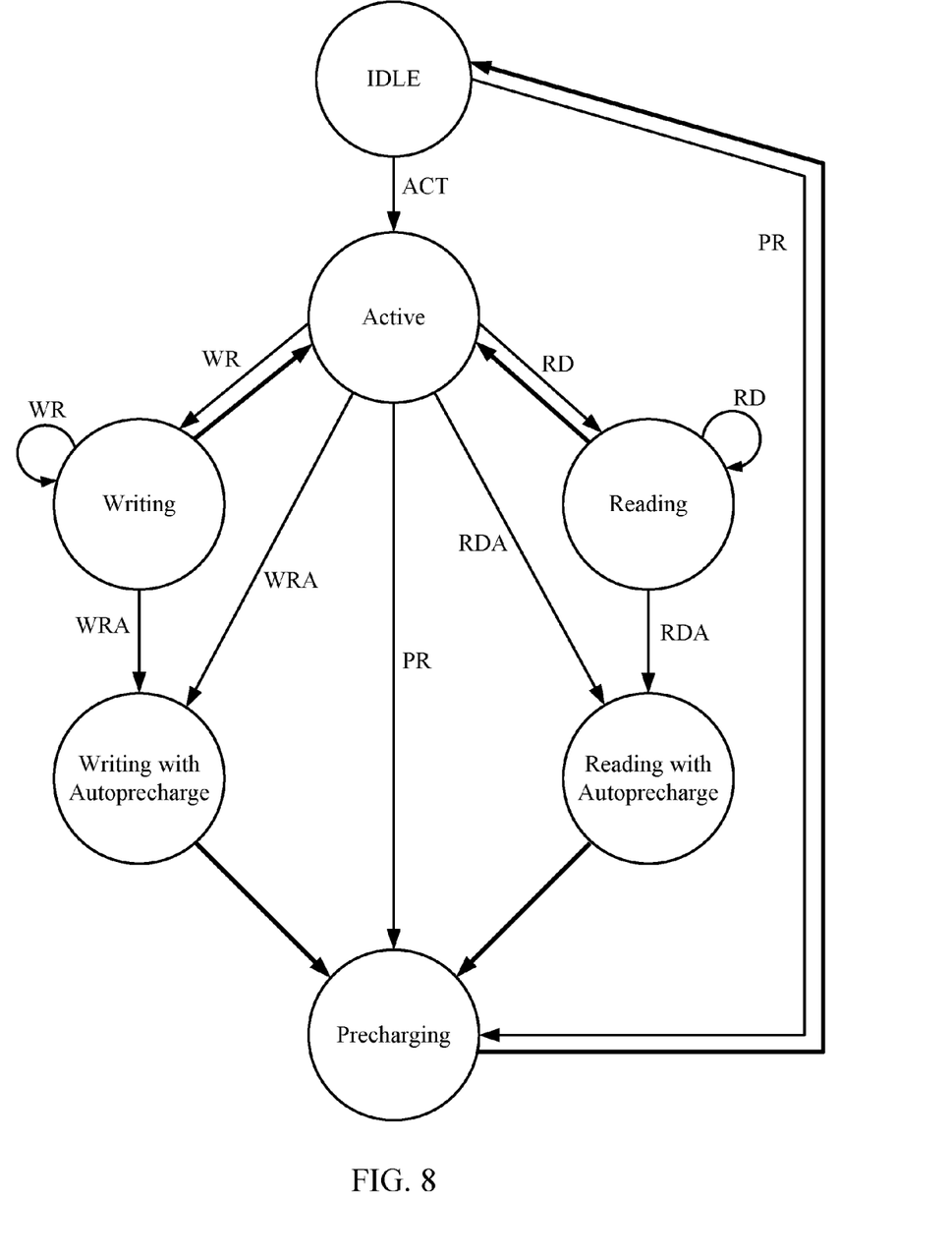
FIG. 8 shows a simplified state diagram of an SDRAM of the prior art.

FIG. 8 shows a simplified state diagram of an SDRAM of the prior art. An SDRAM can be described as a simple state machine having various states. For clarity purpose, FIG. 8 only shows the following states: Idle, Active, Reading, Reading with Auto-Precharge, Writing, Writing with Auto-Precharge, and Precharging. Other states are omitted. For clarity purpose, the state diagram will be described with respect to only one memory array. Transition from one state to another is triggered by a command, and requires a minimum delay time before the state machine is ready to respond to another command. On the state diagram, a state transition is shown as an arrow and the triggering command sequence for the state transition is indicated near the arrow. On the state diagram, an arrow having a fine width indicates a state transition triggered by a command sequence, whereas an arrow having a thick width indicates a state transition triggered by an automatic sequence.

After an initialization sequence is performed or after a Refresh operation, the SDRAM is in the Idle state. In the Idle state, the memory array is precharged.

Before the SDRAM is ready to respond to a read or a write command, a row in a memory array must first be opened, i.e., activated. To activate a row in a memory array, the memory controller sends an Activate (ACT) command specifying the memory array and the row to be accessed. In response to the Active command, the state machine moves from the Idle state to the Active state. The time required to activate a row is called the Row-Column Delay, also called Row Command Delay or Row Command to Column Command Delay, and is denoted by the symbol $t_{RCD}$. This variable $t_{RCD}$ represents the minimum time needed to latch the Activate command at the command interface of the control circuit of the SDRAM, program the control circuit, and read the data content from the specified row in the memory array into the array of sense amplifiers and latch the data content to the row data buffer in preparation for access to a specified column address within the content of the row.

After the specified row is activated, the array of sense amplifiers and the row data buffer contain content of the specified row. This read from the specified row to the array of sense amplifiers is destructive to the specified row. At this time, a Read (RD) or a Write (WR) command can be issued, specifying the starting column address to be accessed. In response to a Read (RD) command, the state machine transitions from the Active state to the Reading state. In response to a Write (WR) command, the state machine transitions from the Active state to the Writing state. The time to read data at the specified column address from the open row is called the Column Address Strobe (CAS) latency and is denoted by the symbol $t_{CAS}$. The variable $t_{CAS}$ represents the minimum time needed to latch the command at the command interface of the control circuit of the SDRAM, program the control circuit, gate the requested data from the row data buffer and place the data on the memory bus.

In the SDRAM of the prior art, only one row per memory array may be open at a time. Access to another row in the same memory array requires that the open row be closed first. As long as the row remains open, the memory controller can issue other Read (RD) commands to the same open row, and the state machine stays in the Reading state. Similarly, as long as the row remains open, the memory controller can issue other Write (WR) commands to the same open row, and the state machine stays in the Writing state. When a certain time interval has elapsed without a new Read or Write command, the state machine automatically returns to the Active state. When the open row is no longer needed or when another row in the memory array needs to be open, the memory controller issues a Precharge (PR) command to close the open row. In response to the Precharge (PR) command, the state machine transitions from the Active state to the Precharging state then to the Idle state. To open another row, the memory controller issues another Activation (ACT) command, and the state machine moves from the Idle state to the Active state, as described above.

A Read with Auto-Precharge (RDA) command or a Write with Auto-Precharge (WRA) command can be sent by the memory controller. This will allow the control circuit of the SDRAM to automatically close the open row as soon as certain conditions have been met: (1) A minimum of Bank Activation Time (also called RAS Activation Time, denoted as $t_{RAS}$) has elapsed since the Activation command was issued, and (2) a minimum of Read to Precharge Delay (denoted as $t_{RTP}$) has elapsed since the most recent Read command was issued. In response to a Read with Auto-Precharge (RDA) command, the state machine moves first to the Reading with Autoprecharge state then to the Precharging state then to Idle state. In response to a Write with Auto-Precharge (WRA) command, the state machine moves first to the Writing with Autoprecharge state then to the Precharging state then to the Idle state.

Precharging prepares the data lines and the array of sense amplifiers of the SDRAM to transmit the stored charge in the array of sense amplifiers back into the open row of data elements. Precharging makes the SDRAM core ready to open the next row of data elements. The time to Precharge an open row is called the Row Access Strobe Precharge Delay, also called Bank Precharge Delay, and is denoted by the symbol $t_{RP}$. The minimum time interval between successive Activate commands to the same memory array is called the Row Cycle Time of the memory device and is denoted by the symbol $t_{RC}$. The Row Cycle Time ($t_{RC}$) is equal to the sum of the Bank Activation Time ($t_{RAS}$) and the Bank Precharge Delay ($t_{RP}$). The minimum time interval between two Activation commands to two different memory arrays in the SDRAM is called the Read-to-Read Delay, denoted by the symbol $t_{RRD}$. All the time intervals (also called delays) described above are expressed in clock cycles. To satisfy the required time delays, commands requesting No Operation (denoted as Nop) are sent by the memory controller in between other commands.

Figure 9:
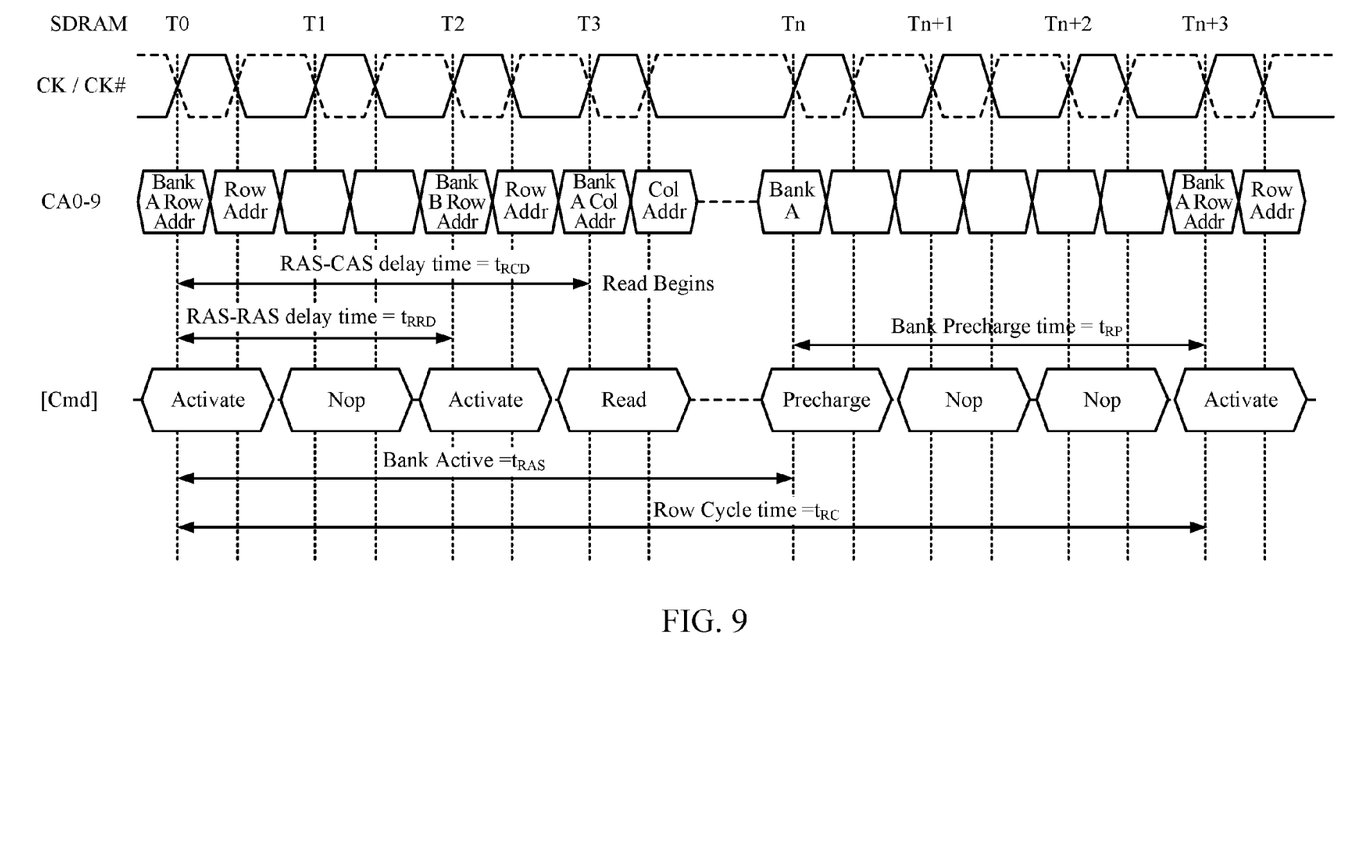
FIG. 9 is a diagram illustrating a timing diagram of two activations of two different rows in a same memory array of a typical SDRAM of the prior art.

FIG. 9 is a diagram illustrating a timing diagram of two activations of two different rows in a same memory array of a typical SDRAM of the prior art.

Referring to FIG. 9, the first line shows the clock signal CK received from the memory controller and its complementary clock signal CK#, with the time axis going from left to right. The second line in FIG. 9 shows the address signals associated with the commands shown on the third line of FIG. 9. The address signals and the commands are received from the memory controller. The Row-Column Delay (denoted by $t_{RCD}$), the Read-to-Read Delay (denoted by $t_{RRD}$), the Bank Activation Time (denoted as $t_{RAS}$), the Bank Precharge Delay (denoted by $t_{RP}$), and the Row Cycle Time (denoted by $t_{RC}$), shown in FIG. 9 are as described in the description of FIG. 8.

Referring to FIG. 9, the second Read command that follows second Activate command is not shown in FIG. 9. Similar to the first Read command, the second Read command issued after the same Row-Column Delay ($t_{RCD}$) has elapsed from the second Activate command. Thus, counting from the completion of the first Read operation to the start of the second Read command, the latency incurred is equal to the sum of the Bank Precharge Delay ($t_{RP}$) and the Row-Column Delay ($t_{RCD}$).

Figure 10:
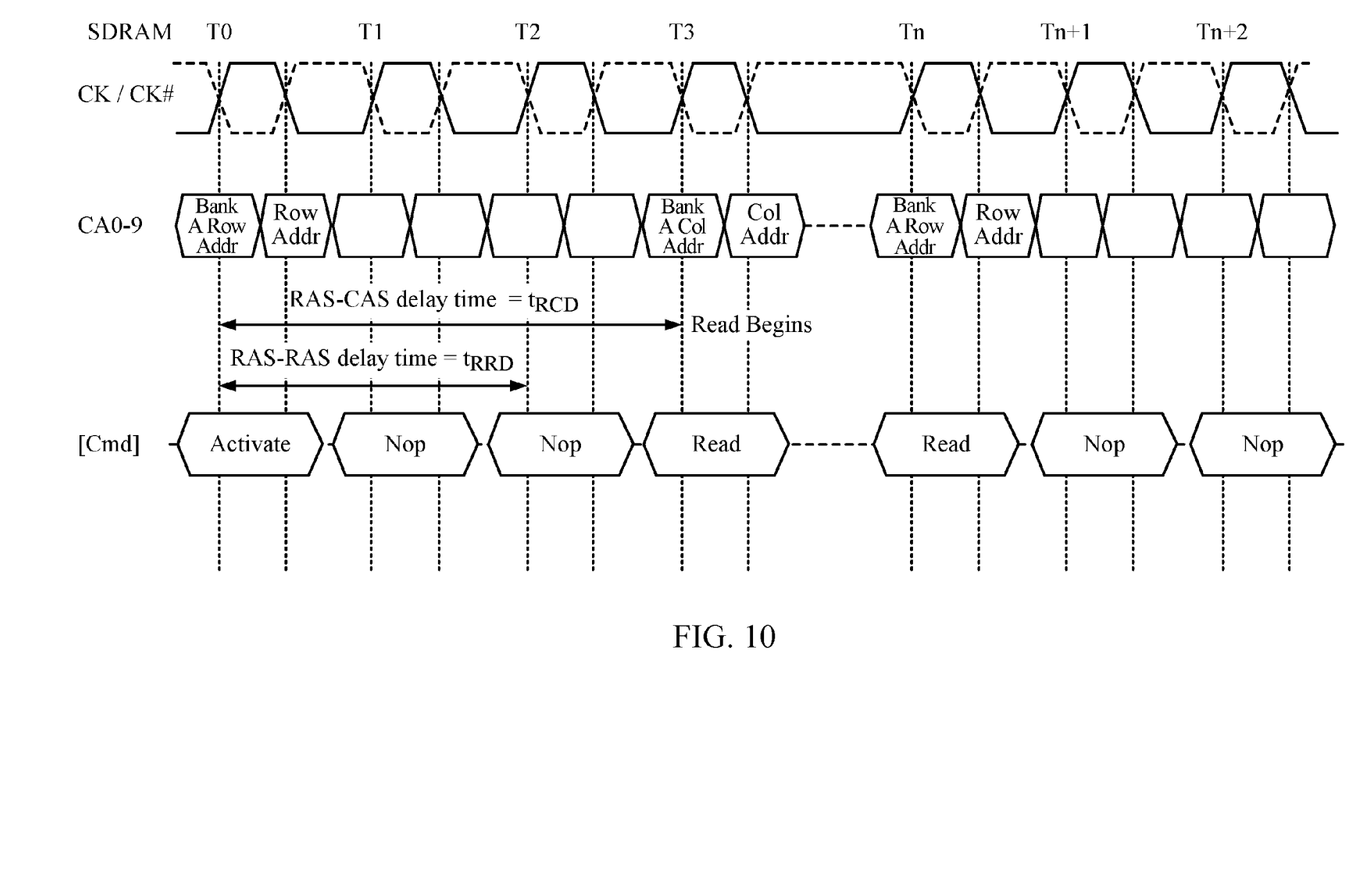
FIG. 10 is a diagram illustrating a timing diagram of two activations of two different rows in a same memory array of an SDRAM constructed in accordance with an embodiment of the present invention.

FIG. 10 is a diagram illustrating a timing diagram of two activations of two different rows in a same memory array of an SDRAM constructed in accordance with an embodiment of the present invention. After an activation command is received from the memory controller 120, more than one row can be open starting from the specified row address and stay open until the open rows are no longer needed or until a command to activate a row that is not currently open is received. The number of rows to be open is adaptable and is determined by the memory controller 120. When accessing a new row that is among the open rows, there is no need to close a currently open row (that is, there is no need to precharge the memory array) and no need to activate the new row. FIG. 10 illustrates such situation. FIG. 10 shows that a Read command to a new row that is among the rows that are already open can be issued at the completion of a previous Read operation without the need for an intervening Precharge command and a new Activate command. Thus, in the situation where, subsequent to a first Read, a second Read is made to a different row that is among the rows that are already open, unlike the SDRAM of the prior art whose timing diagram is shown in FIG. 9, there is no latency due to the Bank Precharge Delay ($t_{RP}$) and the Row-Column Delay ($t_{RCD}$) that are associated with the second Read in the SDRAM of prior art.

Figure 11:
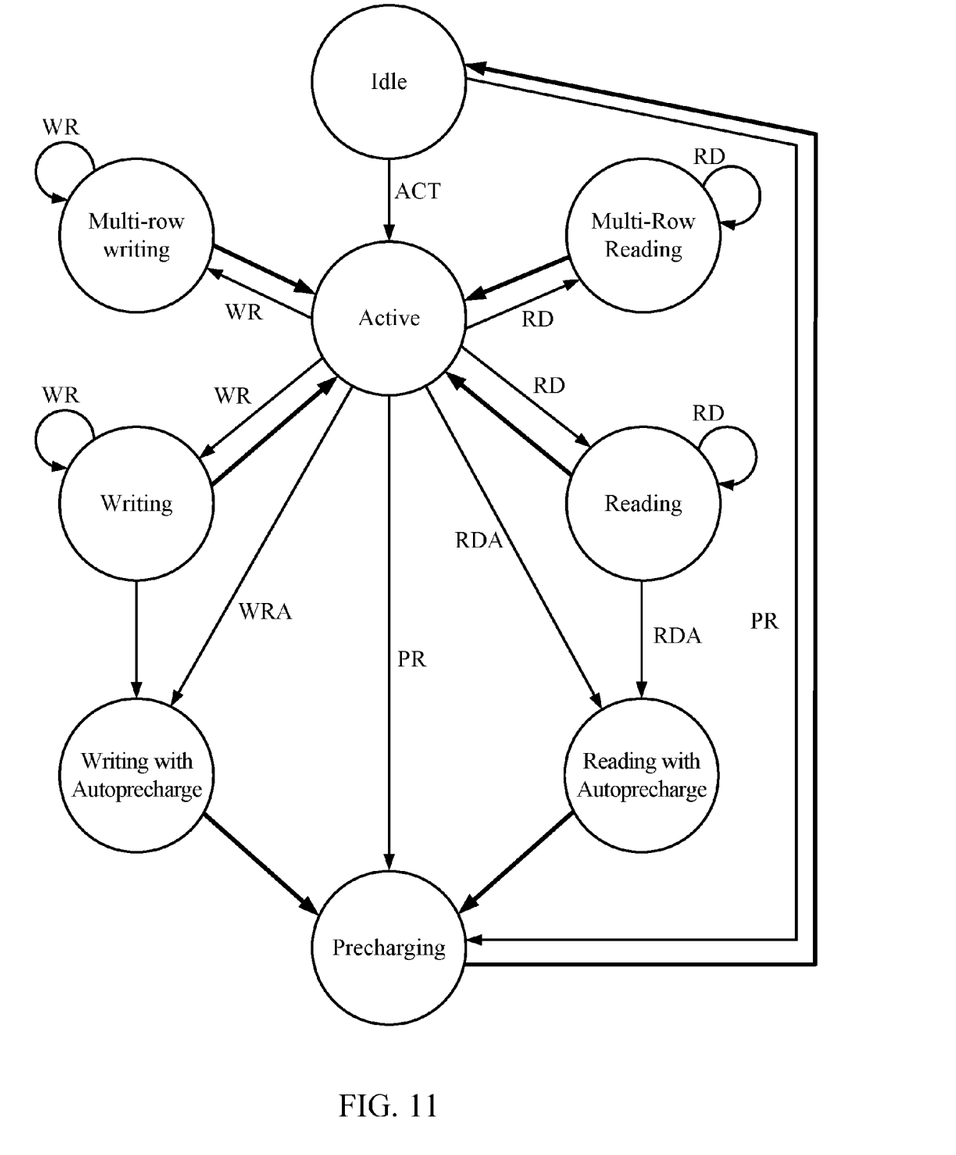
FIG. 11 is a diagram illustrating a simplified state diagram of an SDRAM constructed in accordance with an embodiment of the present invention.

FIG. 11 is a diagram illustrating a simplified state diagram of an SDRAM constructed in accordance with an embodiment of the present invention. The SDRAM constructed in accordance with an embodiment of the present invention can be described as a simple state machine having various states. For clarity purpose, FIG. 11 only shows the following states: Idle, Active, Reading, Multi-row Reading, Multi-row Writing, Reading with Auto-Precharge, Writing, Writing with Auto-Precharge, and Precharging. Other states are omitted. For clarity purpose, the state diagram will be described with respect to only one memory array. Transition from one state to another is triggered by a command, and requires a minimum delay time before the state machine is ready to respond to another command. On the state diagram of FIG. 11, a state transition is shown as an arrow and the triggering command for the state transition is indicated near the arrow. On the state diagram, an arrow having a fine width indicates a state transition triggered by a command sequence, whereas an arrow having a thick width indicates a state transition triggered by an automatic sequence. The state diagram of FIG. 11 differs from the state diagram of FIG. 8 by the addition of the Multi-row Reading state and the Multi-row Writing state.

After an initialization sequence is performed or after a Refresh operation, the SDRAM is in the Idle state. In the Idle state, the memory array is precharged.

To open a row in the SDRAM, the memory controller sends an Activate (ACT) command specifying the memory array and the address of the row to be accessed. The Activate command also includes a row mode indicator to specify the number of successive rows to be open. In response to the Active command, the state machine moves from the Idle state to the Active state.

If the row mode indicator specifies that only one row is to be open, then only the row with the specified row address will be activated. After the specified row is activated, the array of sense amplifiers and the row data buffer contain content of the specified row. This read from the specified row to the array of sense amplifiers is destructive to the specified row. At this time, a Read (RD) or a Write (WR) command can be issued, specifying the starting column address to be accessed. In response to a Read (RD) command, the state machine transitions from the Active state to the Reading state. In response to a Write (WR) command, the state machine transitions from the Active state to the Writing state. As long as the specified row remains open, the memory controller can issue other Read (RD) commands to the same open row, and the state machine stays in the Reading state. Similarly, as long as the specified row remains open, the memory controller can issue other Write (WR) commands to the same open row, and the state machine stays in the Writing state. When a certain time interval has elapsed without a new Read or Write command, the state machine automatically returns to the Active state.

If the row mode indicator specifies N rows to open, where N is greater than one and less than or equal to the total number of row data buffers in the SDRAM, the specified row and N−1 successive rows are activated one at a time. As each of the N rows is activated, the content of the row being activated is read from the row in the memory array into the array of sense amplifiers then to one of the N corresponding row data buffers. In response to a Read (RD) command, the state machine transitions from the Active state to the Multi-row Reading state. In response to a Write (WR) command, the state machine transitions from the Active state to the Multi-row Writing state.

As long as the N rows remains open, the memory controller can issue other Read (RD) commands to any of the N open rows, and the state machine stays in the Multi-row Reading state. Similarly, as long as the N rows remains open, the memory controller can issue other Write (WR) commands to any of the N open rows, and the state machine stays in the Multi-row Writing state. When a certain time interval has elapsed without a new Read or Write command, the state machine automatically returns to the Active state. When the N open rows are no longer needed or when an unopened row in the memory array needs to be open, the memory controller issues a Precharge (PR) command to close the N open rows. In response to the Precharge (PR) command, the state machine transitions from the Active state to the Precharging state then to the Idle state. To open another row, the memory controller issues another Activation (ACT) command, and the state machine moves from the Idle state to the Active state, as described above.

A Read with Auto-Precharge (RDA) command or a Write with Auto-Precharge (WRA) command can be sent by the memory controller. This will allow the control circuit of the SDRAM to automatically close the open rows one at a time as soon as certain conditions have been met: (1) A minimum of Bank Activation Time (also called RAS Activation Time, denoted as $t_{RAS}$) has elapsed since the Activation command was issued, and (2) a minimum of Read to Precharge Delay (denoted as $t_{RTP}$) has elapsed since the most recent Read command was issued. In response to a Read with Auto-Precharge (RDA) command, the state machine moves first to the Reading with Autoprecharge state then to the Precharging state then to Idle state. In response to a Write with Auto-Precharge (WRA) command, the state machine moves first to the Writing with Autoprecharge state then to the Precharging state then to the Idle state.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, some embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Further, all or part of an embodiment may be implemented by various means depending on applications according to particular features, functions. These means may include hardware, software, or firmware, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A memory controller for accessing a memory device, the memory device including a memory array comprising data elements organized into rows and columns, each of the rows being addressable by a row address, each of the data elements in each of the rows being addressable by a column address, the memory device being capable of having an adaptable number of open rows, the memory controller comprising:

an arbiter for receiving and scheduling a memory access request from a requestor, the memory access request including a logical address, the arbiter being configured to determine the adaptable number of open rows for the memory access request; a memory mapper coupled to the arbiter for translating the logical address into a physical address including a row address and a column address; and a command generator coupled to the memory mapper and the arbiter for generating a sequence of commands corresponding to the memory access request and for sending the sequence of commands to the memory device, one command of the sequence of commands including a row mode indicator specifying the adaptable number of open rows;

wherein the arbiter is configured to monitor a memory access pattern of the requestor to determine the adaptable number of open rows by monitoring a ratio of row misses to row hits, and to determine the adaptable number of open rows to be more than one row when the ratio of row misses to row hits exceeds a threshold.

2. The memory controller of claim 1, wherein the arbiter is configured to monitor the memory access pattern of the requestor by to measure memory access locality.

3. The memory controller of claim 1, wherein the arbiter is configured to determine the adaptable number of open rows in accordance with an instruction received from a processor, the instruction specifying the adaptable number of open rows.

4. The memory controller of claim 3, wherein the processor comprises a row determination module configured to determine the adaptable number of open rows based on use cases obtained by monitoring the memory controller.

5. The memory controller of claim 1, wherein the arbiter is configured to receive memory access requests from a plurality of requestors, wherein the arbiter is configured to arbitrate among the plurality of requestors to service one requestor at a time.

6. The memory controller of claim 1, wherein the arbiter schedules the memory access requests for service in an orderly manner.

* * * * *